US011424097B2

(12) United States Patent
Koo et al.

(10) Patent No.: US 11,424,097 B2
(45) Date of Patent: *Aug. 23, 2022

(54) ION SOURCE WITH TUBULAR CATHODE (71) Applicant: APPLIED Materials, Inc., Santa Clara, CA (US)

(72) Inventors: Bon-Woong Koo, Andover, MA (US); Svetlana Radovanov, Brookline, MA (US); Frank Sinclair, Boston, MA (US); You Chia Li, Reading, MA (US); Peter Ewing, South Berwick, ME (US); Ajdin Sarajlic, Bedford, NH (US); Christopher A. Rowland, Rockport, MA (US); Nunzio Carbone, Hamilton, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/923,304

(22) Filed: Jul. 8, 2020

(65) Prior Publication Data
US 2020/0343071 A1 Oct. 29, 2020

Related U.S. Application Data (63) Continuation of application No. 16/355,997, filed on Mar. 18, 2019, now Pat. No. 10,748,738.

(51) Int. Cl.
H01J 37/08 (2006.01)
H01J 37/317 (2006.01)

(52) U.S. Cl.
CPC .......... H01J 37/08 (2013.01); H01J 37/3171 (2013.01); H01J 2237/0815 (2013.01)

(58) Field of Classification Search
CPC .................. H01J 37/08; H01J 37/3171; H01J 2237/0815; H01J 2237/061; H01J 2237/082
See application file for complete search history.

(56) References Cited

U.S. PATENT DOCUMENTS 3,296,442 A * 1/1967 Funfer ..................... H05H 3/06
376/111
3,999,072 A 12/1976 Takagi
(Continued)

FOREIGN PATENT DOCUMENTS

CN 105655217 A 6/2018
JP 2015170451 A 9/2015
KR 10-1858921 B1 6/2018

OTHER PUBLICATIONS

International Search Report dated Jun. 11, 2020 for the International Patent Application No. PCT/US2020/017866, filed on Feb. 12, 2020, 3 pages.

(Continued)

Primary Examiner — Renan Luque
(74) Attorney, Agent, or Firm — KDB Firm PLLC (57) ABSTRACT Provided herein are approaches for increasing efficiency of ion sources. In some embodiments, an apparatus, such as an ion source, may include a chamber housing having a first end wall and a second end wall, and an extraction plate coupled to at least one of the first end wall and the second end wall. The extraction plate may include an extraction aperture. The apparatus may further include a tubular cathode extending between the first end wall and the second end wall.

20 Claims, 9 Drawing Sheets (56) References Cited

U.S. PATENT DOCUMENTS

| | | | |
|---|---|---|---|
| 4,542,321 A | | 9/1985 | Singh et al. |
| 4,774,437 A | | 9/1988 | Helmer et al. |
| 7,786,431 B1 | | 8/2010 | Donofrio et al. |
| 7,812,321 B2 | * | 10/2010 | Kurunczi ................. H01J 27/16 |
| | | | 250/424 |
| 8,759,788 B1 | * | 6/2014 | Bassom ................. H01J 37/08 |
| | | | 250/424 |
| 10,269,530 B1 | * | 4/2019 | Hsu ........................ H01J 27/02 |
| 2003/0197129 A1 | | 10/2003 | Murrell et al. |
| 2006/0030134 A1 | * | 2/2006 | Kim .................... H01J 37/3244 |
| | | | 427/523 |
| 2009/0166554 A1 | * | 7/2009 | Radovanov ............ H01J 27/16 |
| | | | 250/424 |
| 2010/0038556 A1 | * | 2/2010 | Miyamoto ............. H01J 27/08 |
| | | | 250/423 R |
| 2010/0096393 A1 | * | 4/2010 | Asahara ................... H05H 1/24 |
| | | | 220/660 |
| 2014/0042022 A1 | | 2/2014 | Xu et al. |
| 2017/0287579 A1 | * | 10/2017 | Colvin .............. H01J 37/32541 |
| 2018/0254166 A1 | | 9/2018 | Kawaguchi |

OTHER PUBLICATIONS

Written Opinion dated Jun. 11, 2020 for the International Patent Application No. PCT/US2020/017866, filed on Feb. 12, 2020, 4 pages.

\* cited by examiner

ION SOURCE WITH TUBULAR CATHODE

CROSS-REFERENCE TO RELATED APPLICATION

This application is a continuation of U.S. Non-Provisional patent application Ser. No. 16/355,997 filed on Mar. 18, 2019, entitled "Ion Source with Tubular Cathode," and incorporated by reference herein in its entirety.

FIELD OF THE DISCLOSURE

The disclosure relates generally to ion sources, and more particularly to ion sources having a tubular cathode.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile often provides improved IC performance. To achieve a particular doping profile, one or more dopants may be implanted in the form of ions in various doses and various energy levels.

The beam line components of an ion implanter may include a series of electrodes configured to extract ions from the source chamber, a mass analyzer configured with a particular magnetic field where just ions having a desired mass-to-charge ratio are allowed to pass through the analyzer, and a corrector magnet configured to provide a ribbon beam directed to the platen to implant the ions into a target substrate. The ions lose energy when the ions collide with nuclei and electrons in the substrate and come to rest at a desired depth within the substrate based on the acceleration energy. The depth of implantation into the substrate is a function of ion energy and the mass of the ions generated in the source chamber. In some approaches, arsenic or phosphorus may be doped to form n-type regions in a substrate, and boron, gallium, or indium may be doped to create p-type regions in a substrate.

Various types of ion sources may be employed for ionizing feed gases. Such sources may be selected based on the type of plasma intended as well as an associated ion beam profile for implantation into a target substrate. One type of ion source is a hot-cathode ion source utilizing an indirectly heated cathode (IHC) to ionize a feed gas in a source chamber. IHC ion sources may generate a variety of ion species including dopant ions (e.g., $^{11}B^+$) used for implantation into semiconductor substrates to control electronic properties of the semiconductor substrates. With higher doping currents, the efficiency of the IHC ion source in producing $^{11}B^+$ species, for example, is often no greater than 35% of the total extracted current. Even in the case isotopically enriched starting $BF^3$ gas with a minimal amount of $^{10}B$ content is used, IHC efficiency still often does not exceed 40%.

It is with respect to these and other considerations that the present improvements have been needed.

SUMMARY

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

An example ion source in accordance with the present disclosure may include a chamber housing having a first end wall and a second end wall, and an extraction plate coupled to at least one of the first end wall and the second end wall, the extraction plate including an extraction aperture. The ion source may further include a tubular cathode extending between the first end wall and the second end wall.

An example apparatus in accordance with the present disclosure may include a chamber housing having a first end wall and a second end wall, and an extraction plate coupled to the first end wall and the second end wall, wherein the extraction plate includes an extraction aperture. The apparatus may further include a tubular cathode extending between the first end wall and the second end wall, the tubular cathode comprising a cathode opening aligned with the extraction aperture.

An example method in accordance with the present disclosure may include providing a chamber housing having a first end wall and a second end wall, and an extraction plate coupled to the first end wall and the second end wall, wherein the extraction plate includes an extraction aperture. The method may further include providing a tubular cathode extending between the first end wall and the second end wall, the tubular cathode comprising a cathode opening aligned with the extraction aperture. The method may further include generating a plasma within an interior of the tubular cathode.

The drawings are not necessarily to scale. The drawings are merely representations, not intended to portray specific parameters of the disclosure. The drawings are intended to depict example embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, ion sources, and methods in accordance with the present disclosure will now be described more fully hereinafter with reference to the accompanying drawings, where non-limiting embodiments are shown. The apparatuses, ion sources, and methods may be embodied in many different forms and are not to be construed as being limited to the embodiments set forth herein. Instead, these embodiments are provided so the disclosure will be thorough and complete, and will fully convey the scope of the system and method to those skilled in the art.

Provided herein are approaches for increasing efficiency of ion sources. Specifically, ion sources including tubular cathodes allow for larger beam currents of atomic species, such as $^{11}$B, for a given extraction current, resulting in more throughput and/or increased maintenance intervals. The tubular cathode structures described herein have the ability to provide an efficiency greater than or equal to approximately 50%.

Figure 1A:
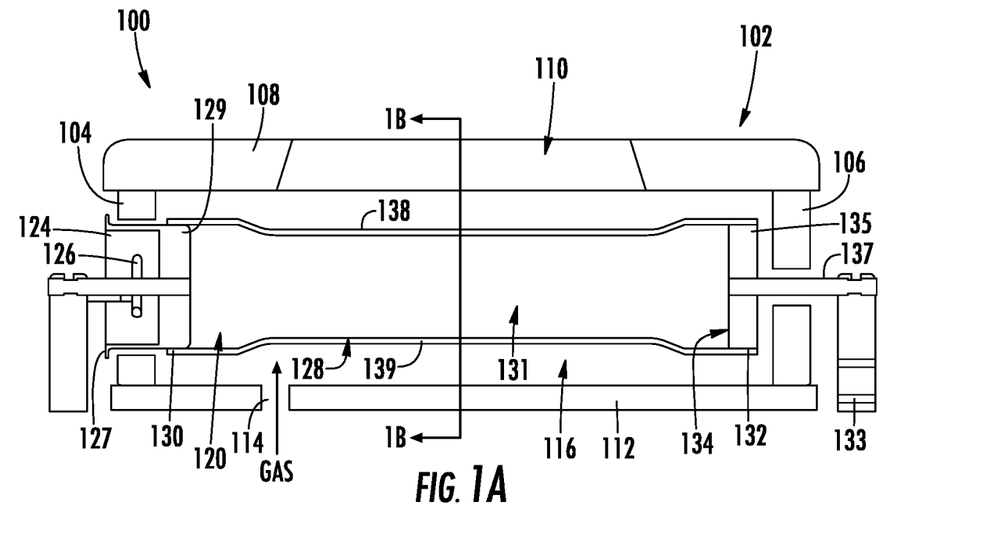
FIG. 1A is a side cross-sectional view of an ion source in accordance with embodiments of the present disclosure.
Figure 1B:
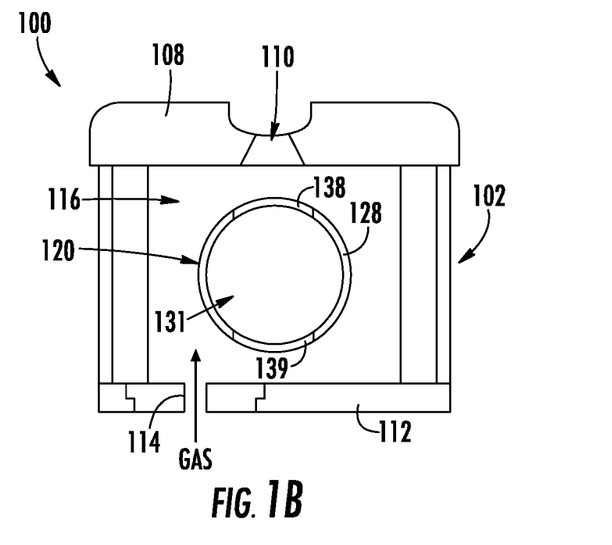
FIG. 1B is an end cross-sectional view of the ion source of FIG. 1A in accordance with embodiments of the present disclosure.

Referring now to FIGS. 1A-1B, a non-limiting embodiment of an ion source 100 for generating plasma in accordance with the present disclosure will be described. The ion source 100 represents an apparatus containing, among other components, a chamber housing 102 including a first end wall 104, a second end wall 106, and an extraction plate 108 coupled to the first and/or second end walls 104, 106. The extraction plate 108 includes one or more extraction slits or apertures 110. The chamber housing 102 may further include a base wall 112 having one or more gas inlets 114 formed therethrough. Together, the first end wall 104, the second end wall 106, the extraction plate 108, and the base wall 112 may define an ion source chamber 116.

In some embodiments, the extraction plate 108 can be made of electrically conducting material, such as doped Si, doped SiC, Aluminum, or Tungsten. During use, the extraction plate 108 may be electrically biased to further control characteristics of plasma generated within the ion source chamber 116.

Although not shown, a gas manifold may provide feed material to the ion source chamber 116 in the form of gaseous species or vapor. Consistent with the present embodiments, suitable feed material includes one or more gaseous compounds of boron (B), carbon (C), phosphorous (P), arsenic (As), silicon (Si), Germanium (Ge), hydrogen (H), and fluorine (F). The embodiments of the present disclosure are not limited in this context. As will be described in greater detail below, the feed material may be ionized in a tubular cathode 120 disposed within the ion source chamber 116.

As shown, the tubular cathode 120 may be coupled to the first end wall 104 and the second end wall 106. In example embodiments, the tubular cathode 120 is electrically isolated from the first end wall 104 and the second end wall 106. Although non-limiting, the tubular cathode 120 may include a cup 124 containing a filament 126, and a main body 128 coupled at a first end 130 to the cup 124. As shown, the cup 124 may be directly coupled to the first end wall 104. More specifically, the cup 124 may include a first end 127 extending through the first end wall 104, and a second end 129 extending within an interior 131 of the tubular cathode 120 and secured in place using any variety of means. A second end 132 of the main body 128 may be coupled to a repeller 134. As shown, the repeller 134 may include a repeller head 135 extending from a shaft 137, the shaft 137 being directly coupled to the second end wall 106. More specifically, the shaft 137 may extend through the second end wall 106. In some embodiments, the shaft 137 is electrically isolated from the second end wall 106. As shown, the repeller head 135 may be positioned within the interior 131 of the tubular cathode 120, and secured in place using a variety of means. In certain embodiments, the shaft 137 may be held in place by a clamp 133 on the exterior of the ion source chamber 116. The shaft 137 may have a smaller cross-sectional area than the repeller head 135, wherein the repeller head 135 provides a biased surface to confine the electrons. The shaft 137 is further intended to provide mechanical support and electrical conductivity to the clamp 133.

The main body 128 of the tubular cathode 120 may include a cathode opening 138 generally aligned with the extraction aperture 110 of the extraction plate 108. The main body 128 of the tubular cathode 120 may further include a gas opening 139 proximate the base wall 112. The gas opening 139 may receive a gas delivered through the gas inlet 114. During use, an arc plasma may be generated within the interior 131 of the tubular cathode 120 when the tubular cathode 120 is heated and a potential difference (voltage) is applied between the tubular cathode 120 and the chamber housing 102. The high-density plasma generated inside the interior 131 of the cathode 120 is expanded towards the extraction aperture 110 through the cathode opening 138. In some embodiments, the first end wall 104, the second end wall 106, the extraction plate 108 and the base wall 112 of the source housing 102 are at a same potential. Furthermore, the cup 124, the tubular cathode 120, the clamp 133, and the repeller 134 are electrically connected and therefore at a same electrical potential. The ion source 100 may be coupled to various conventional components not depicted for clarity, including power supplies for the tubular cathode 120 and the filament 126.

In various embodiments, feed material may be supplied in the form of halogen species. For example, the ion source 100 may be employed for ion implantation of B, P, As, Si, Ge, or other species, each of which may be derived from a halogen-containing precursor species. Examples of halogen species used as precursors for ions generated by the ion source 100 include $BF_3$, $PF_3$, $SiF_4$, $B_2F_4$, $AsF_5$, $GeF_4$ among other species. Moreover halogen species include products of another halogen species. For example, $BF_3$ gas may be provided to the ion source 100 and $BF_3$ ions, $BF_2$ neutrals, $BF_2$ ions, BF neutrals, BF ions, and F neutrals, F positive and negative ions and other heavy neutral radicals or ions $B_xF_y$, among others may all be produced through one or more processes from the parent $BF_3$ gas and are all deemed to be halogen species. The embodiments of the present disclosure are not limited in this context.

Figure 2A:
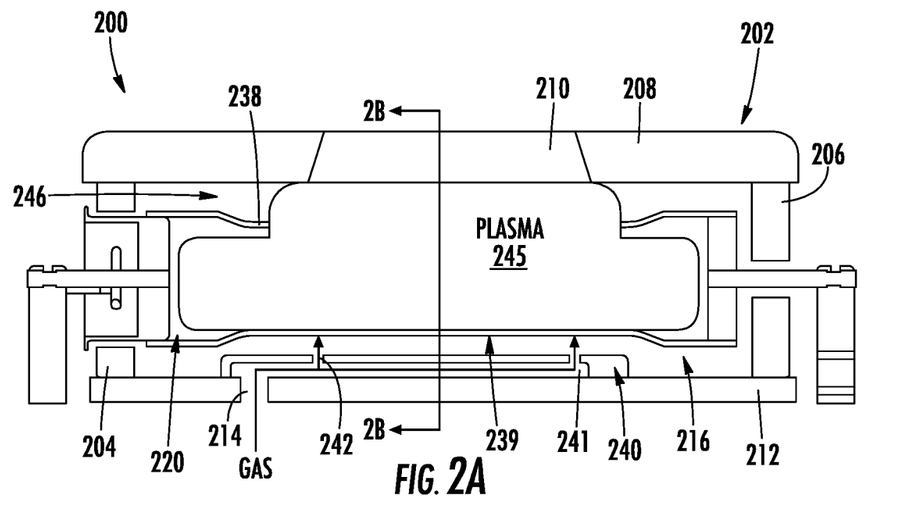
FIG. 2A is a side cross-sectional view of an ion source in accordance with embodiments of the present disclosure.
Figure 2B:
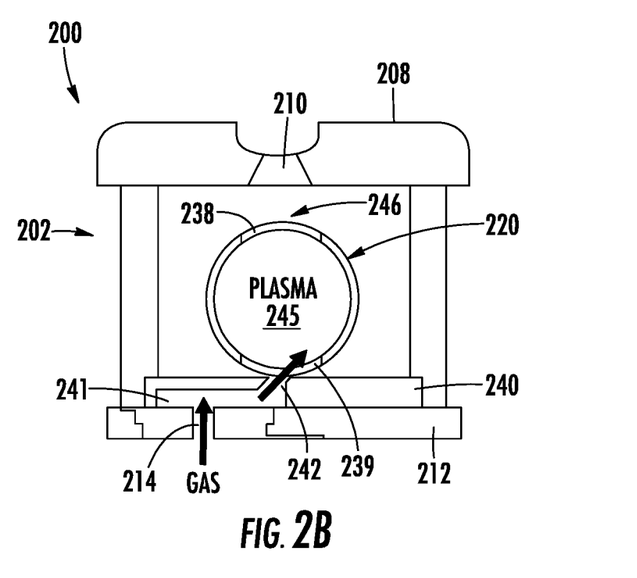
FIG. 2B is an end cross-sectional view of the ion source of FIG. 2A in accordance with embodiments of the present disclosure.

Referring now to FIGS. 2A-2B, a non-limiting embodiment of an ion source 200 for generating plasma in accordance with the present disclosure will be described. The ion source 200 is similar to the ion source 100 of FIGS. 1A-1B.

As such, not all details of the ion source 200 will hereinafter be described for the sake of brevity. The ion source 200 represents an apparatus containing, among other components, a chamber housing 202 including a first end wall 204, a second end wall 206, and an extraction plate 208 coupled to the first and/or second end walls 204, 206. The extraction plate 208 includes one or more extraction slits or apertures 210. The chamber housing 202 may further include a base wall 212 having one or more gas inlets 214 formed therethrough. Together, the first end wall 204, the second end wall 206, the extraction plate 208, and the base wall 212 may define an ion source chamber 216.

The ion source 200 may further include a gas diffuser 240 operable to receive the gas from the gas inlet 214, and direct the gas towards a tubular cathode 220. For example, the gas diffuser 240 may provide feed material in the form of gaseous species or vapor, which is ionizable in the tubular cathode 220 located within the ion source chamber 216. Although not limited to any particular configuration, the gas diffuser 240 may include a chamber 241 and a plurality of outlets 242 operable to deliver the gas towards a gas opening 239 of the tubular cathode 220. As shown, the gas diffuser 240 may be coupled to, and positioned directly adjacent to, an interior of the base wall 212. The gas diffuser 240 may ensure a more even distribution of gas into the tubular cathode 220, which in turn results in a more even and efficient generation of a plasma 245 within the tubular cathode 220. As shown, the plasma 245 may expand and diffuse across an extraction gap 246 between a cathode opening 238 and the extraction aperture 210 of the extraction plate 208. Consistent with the present embodiments, suitable feed material includes one or more gaseous compounds of boron (B), carbon (C), phosphorous (P), arsenic (As), silicon (Si), germanium (Ge), hydrogen (H), and fluorine (F). The embodiments of the present disclosure are not limited in this context.

Figure 3:
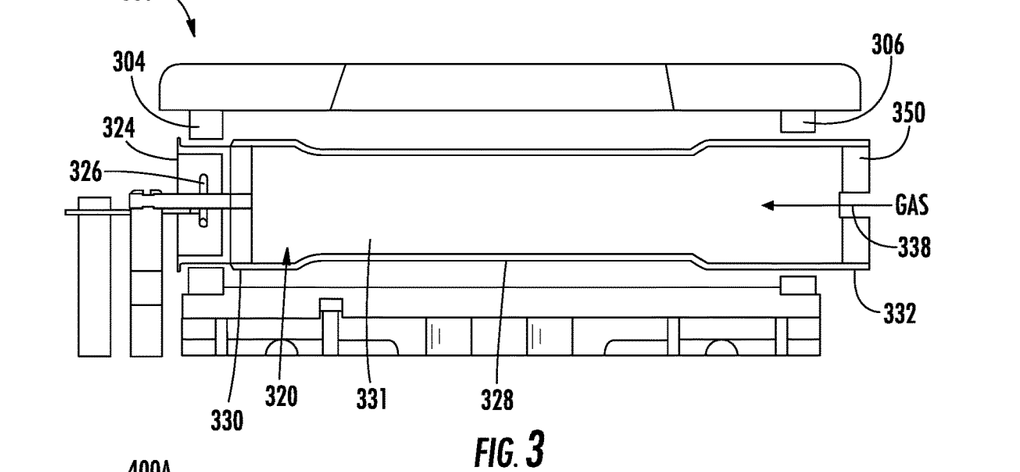
FIG. 3 is a side cross-sectional view of an ion source in accordance with embodiments of the present disclosure.
Figure 4A:
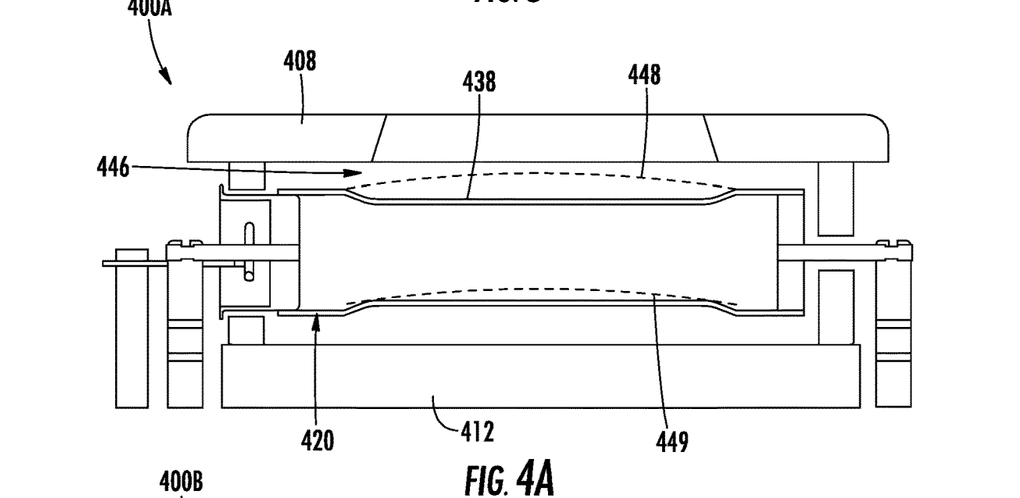
FIG. 4A is a side cross-sectional view of an ion source in accordance with embodiments of the present disclosure.
Figure 4B:
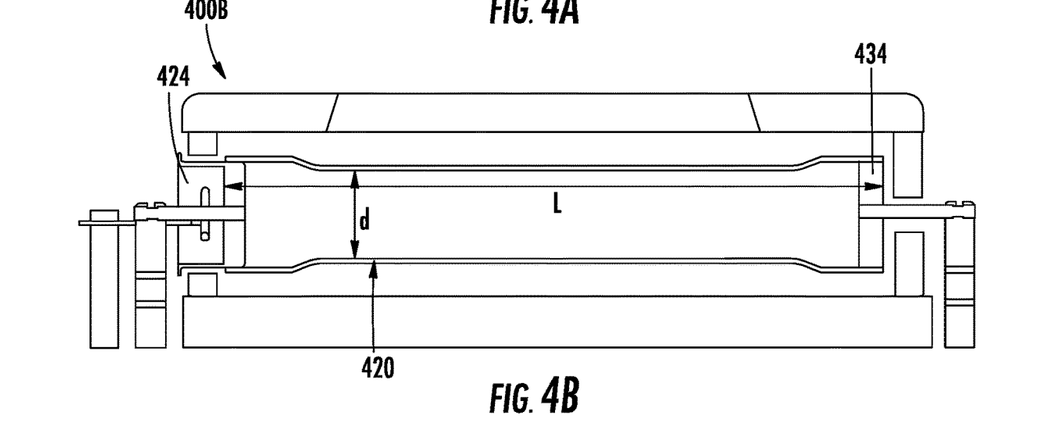
FIG. 4B is a side cross-sectional view of an ion source in accordance with embodiments of the present disclosure.

FIGS. 3-4B demonstrate various non-limiting embodiments of ion sources in accordance with the present disclosure will be described. The ion sources 300, 400A, and 400B are similar to the ion sources 100 and 200 described above. As such, not all details of the ion sources 300, 400A, and 400B will hereinafter be described for the sake of brevity. As shown in FIG. 3, the ion source 300 includes a tubular cathode 320 coupled to a first end wall 304 and a second end wall 306. Although non-limiting, the tubular cathode 320 may include a cup 324 containing a filament 326, and a main body 328 coupled at a first end 330 to the cup 324. As shown, the cup 324 may be directly coupled to the first end wall 304, and may extend into an interior 331 of the tubular cathode 320. At a second end 332 of the tubular cathode 320 is a cathode end wall 350. The cathode end wall 350 may include a cathode opening 338 formed therein. As shown, the cathode opening 338 may allow delivery of a gas into the interior 331 of the tubular cathode 320. In some embodiments, the cathode opening 338 may be provided though the cathode end wall 350 as opposed to through a wall of the main body 328. In yet other embodiments, gas inlet openings may be provided through both the cathode end wall 350 and the main body 328.

As shown in FIG. 4A, the ion source 400A may include a tubular cathode 420 having a curved or varied shape. For example, an upper side 448 of the tubular cathode 420, proximate an extraction plate 408, may be bowed or generally convex. A lower side 449 of the tubular cathode 420, proximate a base wall 412, may be generally concave. The tubular cathode 420 may be configured to generally follow the shape of extraction optics (not shown). Furthermore, this configuration reduces an extraction gap 446 between a cathode opening 438 and the extraction plate 408, resulting in more efficient operation.

As shown in FIG. 4B, the ion source 400B may include a tubular cathode 420 having an increased length 'L'. Advantageously, the tubular cathode 420 of the present disclosure provides greater scalability. With conventional IHCs having only a cathode cup and repeller, plasma becomes increasingly unstable and non-uniform as the length of the ion source increases. The tubular cathode 420 of the present disclosure provides a reduced volume vessel, permitting plasma generated therein to be more stable and uniform. In one non-limiting example, the length L is approximately 500 mm and the diameter may be approximately 12 mm. Said differently, the length may be up to 40× greater than the diameter.

Figure 5A:
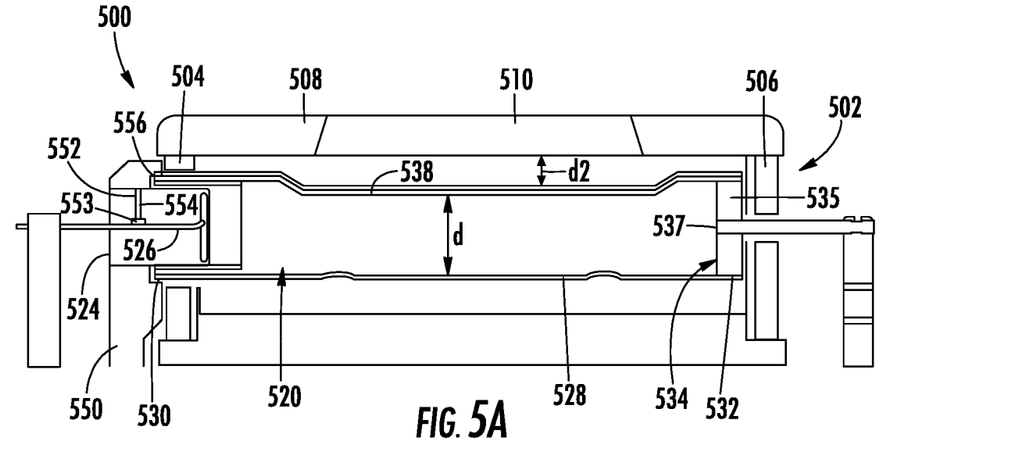
FIG. 5A is a side cross-sectional view of an ion source in accordance with embodiments of the present disclosure.
Figure 5B:
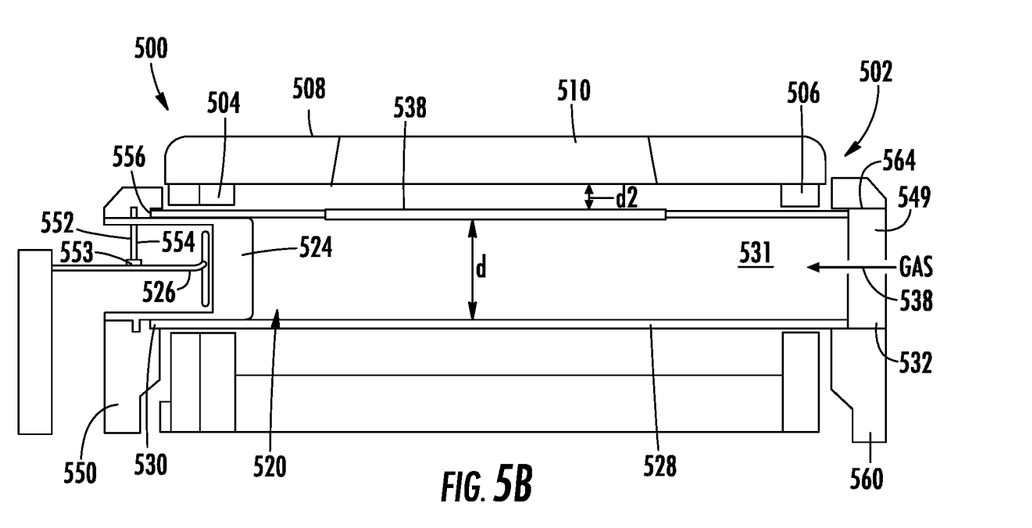
FIG. 5B is a side cross-sectional view of an ion source in accordance with embodiments of the present disclosure.

Referring now to FIGS. 5A-5B, non-limiting embodiments of an ion source 500 for generating plasma in accordance with the present disclosure will be described. The ion source 500 is similar to the ion sources 100, 200, 300, 400A, 400B described above. As such, not all details of the ion source 500 will hereinafter be described for the sake of brevity. The ion source 500 represents an apparatus containing, among other components, a chamber housing 502 including a first end wall 504, a second end wall 506, and an extraction plate 508 coupled to the first and/or second end walls 504, 506.

As shown, a tubular cathode 520 may extend between the first end wall 504 and the second end wall 506. Although non-limiting, the tubular cathode 520 may include a cup 524 containing a filament 526, and a main body 528 coupled at a first end 530 to the cup 524. As shown, the cup 524 may be directly coupled to a cathode support 550. In some embodiments, the cup 524 may be received through an opening of the cathode support 550. Although non-limiting, the cathode support 550 and the cup 524 may join together by means of a slot 552 and a fastener 553. For example, the fastener 553 may be inserted through a notch 554 of the slot 552, and the cup 524 then rotated to move the fastener 553 within the slot 552. The embodiments of the present disclosure are not limited in this context. As further shown, the first end 530 of the main body 528 may extend partially into the cathode support 550. In some embodiments, the cathode support 550 may include a recess 556 to receive the first end 530 of the main body 528.

As shown in FIG. 5A, a second end 532 of the main body 528 may be coupled to a repeller 534. The repeller may include a repeller head 535 extending from a shaft 537, the shaft 537 extending through the second end wall 506. Alternatively, as shown in FIG. 5B, the second end 532 of the main body 528 may be coupled to a second cathode support 560. The second cathode support 560 may be the same or similar to the cathode support 550. For example, the second end 532 of the main body 528 may be received through an opening 564 of the second cathode support 560. As shown, the second end 532 includes a cathode end wall 549 having a cathode opening 538 formed therein. The cathode opening 538 may allow delivery of a gas into the interior 531 of the tubular cathode 520.

The cathode supports 550, 560 may each act as a heat shield, providing thermal and mechanical isolation from the higher temperature tubular cathode 520. As a result of thermal and mechanical isolation, the cathode supports 550, 560 permit a lower bias power, therefore reducing the likelihood of source failure. Furthermore, in this embodiment, the tubular cathode 520 may have a reduced diameter 'd', resulting in smaller plasma volume, and requiring less arc power. As a result, an extraction gap 'd2' between a cathode opening 538 and an extraction slit 510 of the extraction plate 508 may also be reduced to provide more efficient operation.

Figure 6:
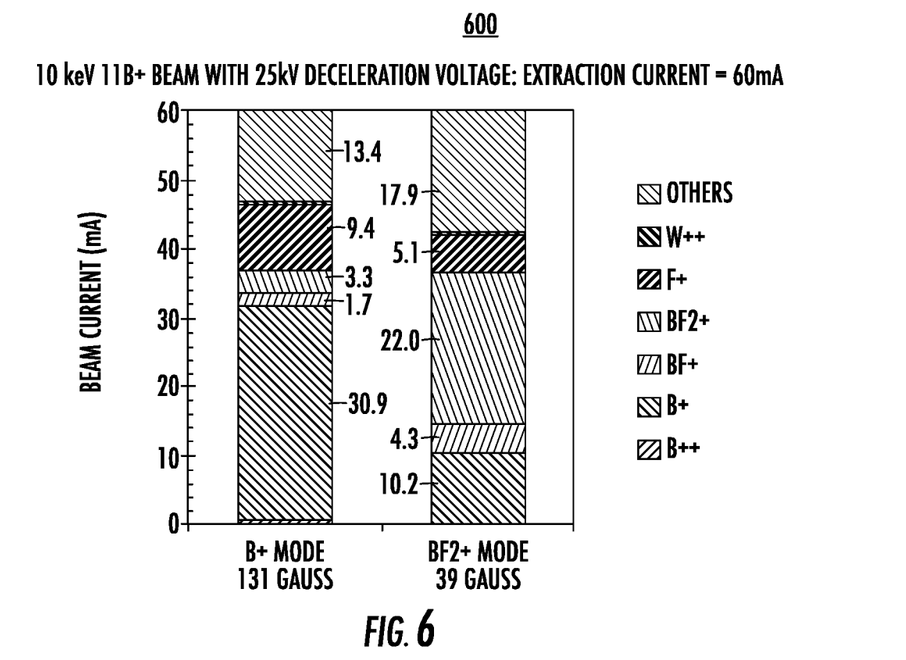
FIG. 6 is a chart demonstrating tubular cathode performance according to embodiments of the present disclosure.

Referring now to FIG. 6, a chart 600 demonstrating tubular cathode performance according to embodiments of the present disclosure is shown. The chart 600 shows various species (e.g., $W^{++}$, $F^+$, $BF^{2+}$, $BF^+$, $B^+$, and $B^{++}$) used as precursors for ions generated by an ion source, such as any of the ion sources described above. Assuming 10 keV beam with 25 kV D1, the chart 600 shows $B^+$ mode and $BF^{2+}$ mode vs. beam current. As demonstrated, by changing the source magnet only, it is possible to switch to a different mode.

Figure 7:
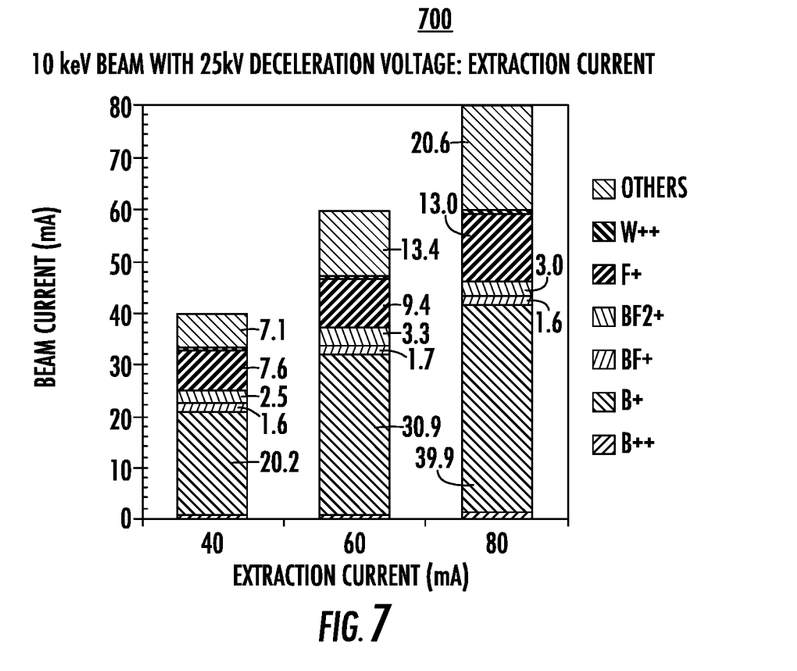
FIG. 7 is a chart demonstrating tubular cathode performance according to embodiments of the present disclosure.

FIG. 7 is a chart 700 demonstrating tubular cathode performance according to embodiments of the present disclosure. The chart 700 shows various species (e.g., $W^{++}$, $F^+$, $BF^{2+}$, $BF^+$, $B^+$, and $B^{++}$) used as precursors for ions generated by an ion source, such as any of the ion sources with tubular cathodes described above. Assuming 10 keV beam with 25 kV deceleration voltage, the chart 700 demonstrates extraction current vs. beam current. As shown, it's possible to maintain $B^+$ fraction of approximately 50% up to 80 mA of extraction current.

Figure 8A:
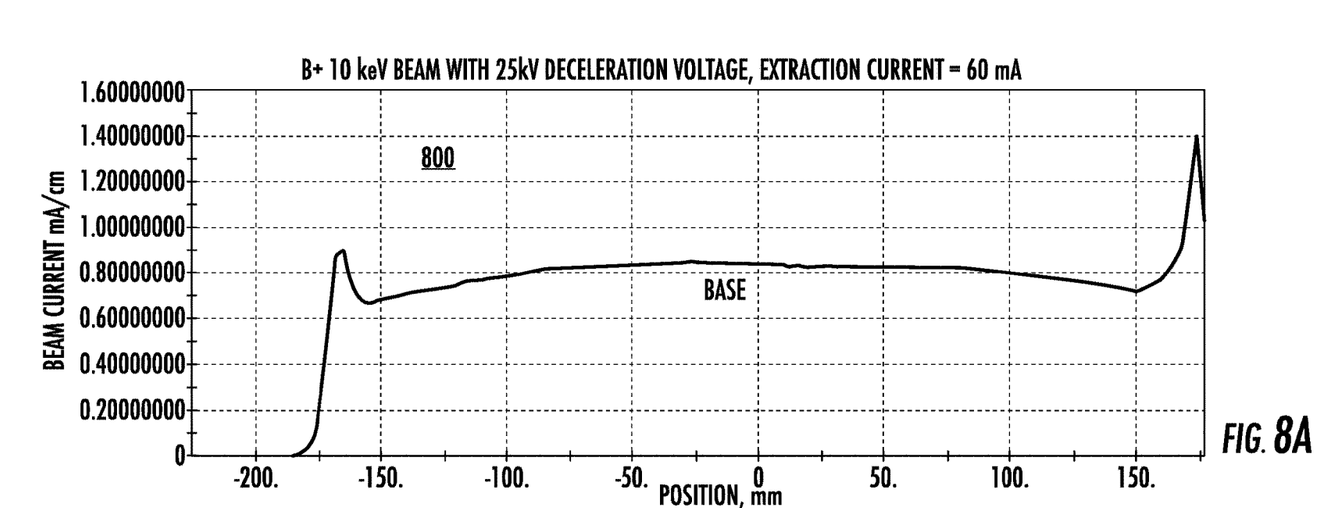
FIGS. 8A-8B are charts demonstrating uniformity of tubular cathode performance according to embodiments of the present disclosure.
Figure 8B:
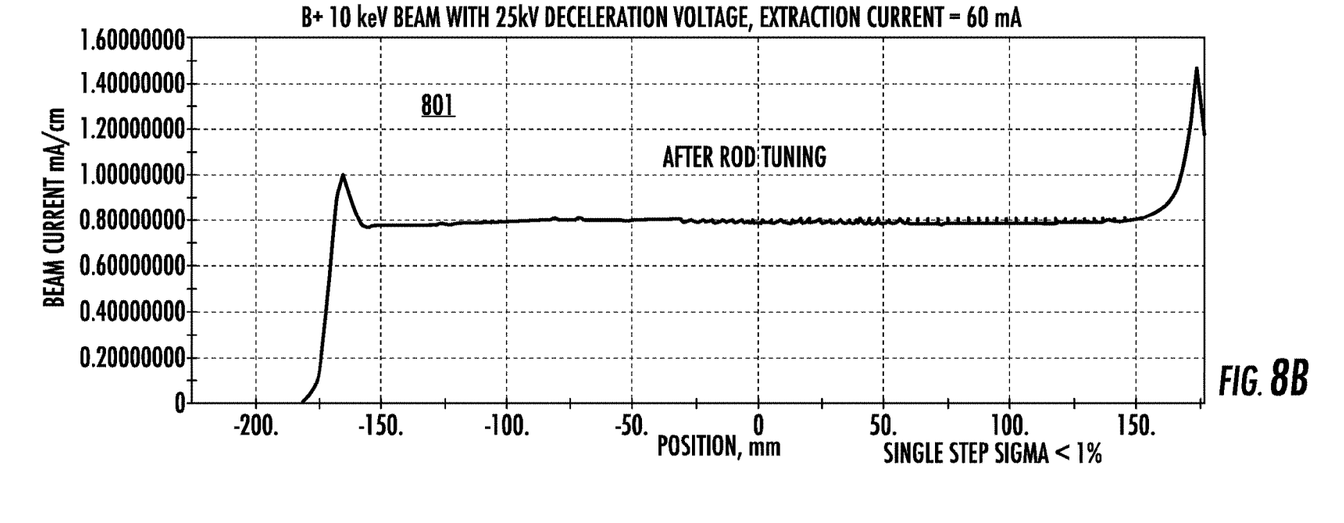

FIGS. 8A-8B are charts 800, 801 demonstrating uniformity of tubular cathode performance according to embodiments of the present disclosure. Assuming $B^+$+10 keV beam with 25 kV deceleration voltage, and extraction current=60 mA, FIG. 8A demonstrates position vs. beam current for a base. FIG. 8B demonstrates position vs. beam current after rod tuning. As shown, the tubular cathodes disclosed herein provide approximately uniform tuning equivalent to, or better than, standard IHC configurations.

Figure 9A:
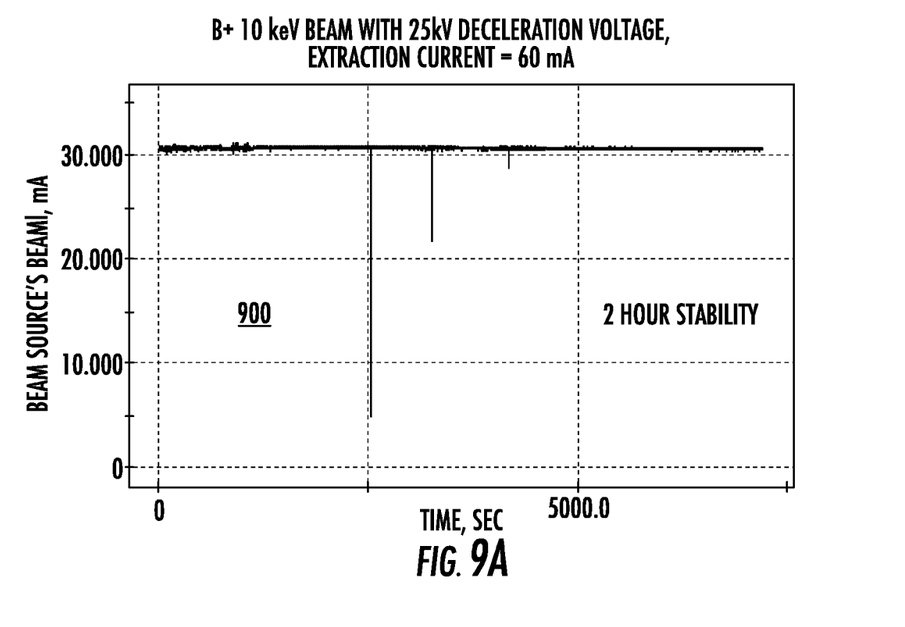
FIGS. 9A-9B are charts demonstrating stability of tubular cathode performance according to embodiments of the present disclosure.
Figure 9B:
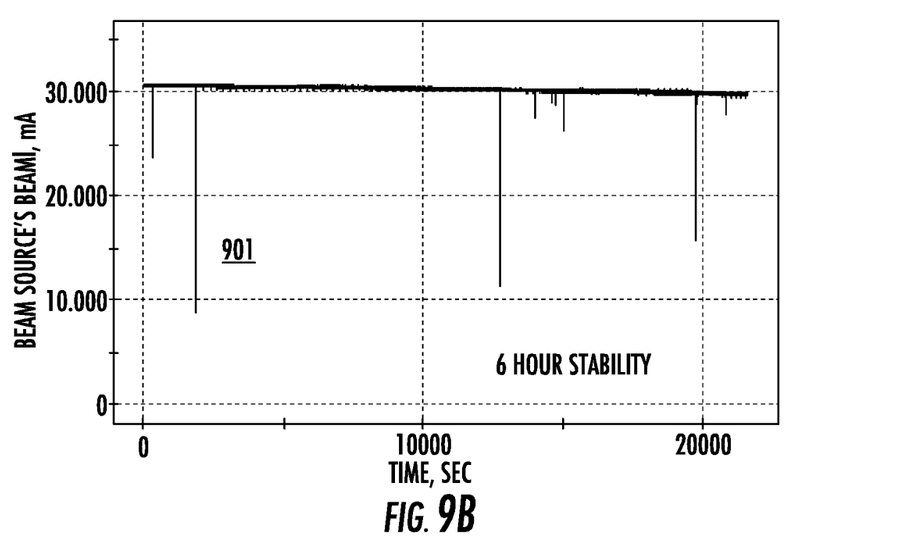

FIGS. 9A-9B demonstrating stability of tubular cathode performance according to embodiments of the present disclosure. Assuming $B^+$10 keV beam with 25 kV deceleration voltage, and extraction current=60 mA, the chart 900 of FIG. 9A demonstrates time v. beam source's beam current after two (2) hours, while the chart 901 of FIG. 9B demonstrates time v. beam source's beam current after six (6) hours. As shown, the beam current is stable and relatively uniform during a 2-hour sample run. Beam current drops slightly (e.g., by approximately 1 mA) during a 6-hour sample run.

Figure 10:
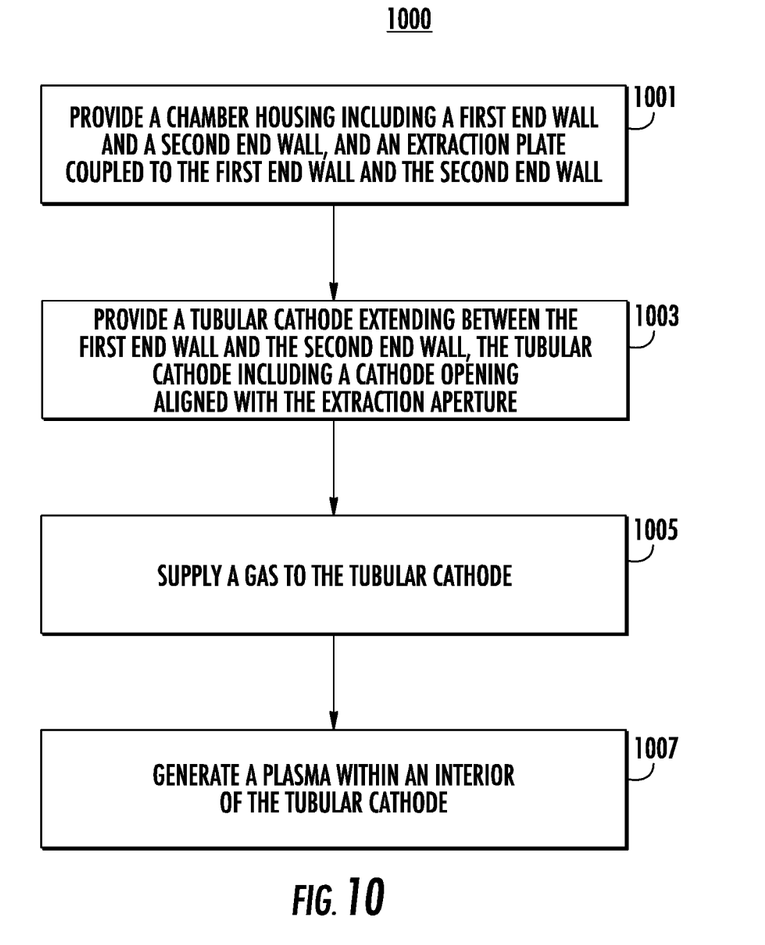
FIG. 10 is a flowchart illustrating an example method in accordance with embodiments of the present disclosure.

Referring now to FIG. 10, a flow diagram illustrating an example method 1000, for adjusting a volume of a plasma chamber in accordance with the present disclosure is shown. At block 1001, the method 1000 may include providing a chamber housing including a first end wall and a second end wall, and an extraction plate coupled to the first end wall and the second end wall. The extraction plate may include an extraction aperture.

At block 1003, the method 1000 may further include providing a tubular cathode extending between the first end wall and the second end wall, the tubular cathode including a cathode opening aligned with the extraction aperture. In some embodiments, the tubular cathode may be coupled to the first end wall and the second end wall. Although non-limiting, the tubular cathode may include a cup containing a filament, and a main body coupled at a first end to the cup. A second end of the main body of the tubular cathode may be coupled to a repeller. In some embodiments, the tubular cathode is coupled to a cathode support, wherein the cathode support is located external to the chamber housing.

At block 1005, the method may further include supplying a gas to the tubular cathode. In some embodiments, the main body of the tubular cathode may include one or more gas openings proximate a base wall of the chamber housing. The gas opening(s) may receive a gas delivered through a gas inlet of the base wall. In other embodiments, a cathode end wall may include a cathode opening formed therein, wherein the cathode opening allows delivery of a gas into the interior of the tubular cathode. In some embodiments, a gas diffuser may be present within the chamber housing, wherein the gas diffuser is operable to receive and distribute gas from the gas inlet towards the tubular cathode.

At block 1007, the method 1000 may include generating a plasma within an interior of the tubular cathode. The plasma may be delivered across an extraction gap between a cathode opening and the extraction plate.

Although the illustrative method 1000 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the method 1000 may be implemented in association with the formation and/or processing of structures illustrated and described herein as well as in association with other structures not illustrated.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In view of the foregoing, at least the following advantages are achieved by the embodiments disclosed herein. A first advantage of the tubular cathode described herein includes larger beam currents of atomic species such as 11B for a given extracted current, resulting in higher throughput for a given source extracted current. A second advantage of the tubular cathode described herein is longer maintenance intervals. A third advantage of the tubular cathode described herein is a $B^+$ fraction of greater than or equal to approximately 50%. A fourth advantage is a smaller plasma volume due to the smaller cathode, resulting in a reduced arc power. A fifth advantage is a more efficient operation due to a shorter distance between the tubular cathode and the extraction slit. A sixth advantage is reduced source failure due to lower bias power, as the tubular cathode is positioned on one or more cathode holders. The cathode holders act as heat shields, providing mechanical/thermal isolation from the hot cathode. A seventh advantage of the tubular cathode is increased plasma density due to the reduced volume of the tubular cathode. Unlike prior ion source designs wherein the plasma is generated within the greater volume of the source chamber, plasma of the present disclosure is generated within the smaller dimensioned tubular cathode.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion source, comprising:
   a chamber housing; and
   a tubular cathode within the chamber housing, the tubular cathode comprising:
      a main body having a cathode opening;
      a cup directly coupled to a first end of the main body; and
      a repeller directly coupled to a second end of the main body.

2. The ion source of claim 1, wherein the chamber housing further comprises an extraction plate, a first end wall, and a second end wall, and wherein the cathode opening is operable to deliver a plasma towards an extraction aperture of the extraction plate.

3. The ion source of claim 2, wherein the main body is a tube having a bowed shape, and wherein a distance between an exterior of the main body and the extraction plate varies along a length of the main body extending between the first end wall and the second end wall.

4. The ion source of claim 2, wherein the repeller comprises a shaft extending through the second end wall.

5. The ion source of claim 4, wherein the repeller further comprises a repeller head extending from the shaft, and wherein an exterior surface of the repeller head is in direct physical contact with an interior surface of the main body.

6. The ion source of claim 2, the tubular cathode further comprising a filament within the cup, wherein the cup extends through the first end wall of the chamber housing, and wherein the main body extends over the cup.

7. The ion source of claim 1, the main body further comprising a gas inlet aperture operable to receive a gas.

8. The ion source of claim 7, wherein the gas inlet aperture is provided through a cathode end wall.

9. The ion source of claim 1, further comprising a cathode support, wherein the tubular cathode is mechanically coupled to the cathode support.

10. An ion source, comprising:
    a chamber housing including an extraction plate; and
    a tubular cathode within the chamber housing, the tubular cathode comprising:
       a main body having a cathode opening;
       a cup directly coupled to a first end of the main body; and
       a repeller directly coupled to a second end of the main body.

11. The ion source of claim 10, wherein the cathode opening is operable to deliver a plasma towards an extraction aperture of the extraction plate.

12. The ion source of claim 10, wherein the main body is a tube having a bowed shape, and wherein a distance between an exterior of the main body and the extraction plate varies along a length of the main body.

13. The ion source of claim 10, wherein the repeller comprises:
    a shaft extending through a wall of the chamber housing; and
    a repeller head extending from the shaft, and wherein an exterior surface of the repeller head is in direct physical contact with an interior surface of the main body.

14. A cathode, comprising:
    a main body having a cathode opening;
    a cup directly coupled to a first end of the main body; and
    a repeller directly coupled to a second end of the main body, the repeller comprising a repeller head extending from a shaft, wherein an exterior surface of the repeller head is in direct physical contact with an interior surface of the main body, and wherein the repeller head provides a biased surface to confine electrons.

15. The cathode of claim 14, the main body defining an interior cavity operable to contain a plasma.

16. The cathode of claim 14, wherein the shaft is operable to extend through a wall of a chamber housing.

17. The cathode of claim 14, further comprising a filament within the cup, wherein the main body extends over the cup.

18. The cathode of claim 14, the main body further comprising a gas inlet aperture operable to receive a gas.

19. The cathode of claim 18, wherein the gas inlet aperture is provided through a cathode end wall.

20. The cathode of claim 14, wherein the main body is a tube having a bowed shape, and wherein a distance between an exterior of the main body and an extraction plate of an ion source varies along a length of the main body.

* * * * *